(12) United States Patent
Su et al.

(10) Patent No.: US 9,269,840 B2
(45) Date of Patent: *Feb. 23, 2016

(54) METHOD FOR FORMING A SOLAR CELL WITH TREE-LIKE NANOSTRUCTURE

(75) Inventors: Wei-Fang Su, Taipei (TW); Chun-Wei Chen, Taipei (TW); Jih-Jen Wu, Tainan (TW); Yun-Yue Lin, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 966 days.

This patent is subject to a terminal disclaimer.

(21) Appl. No.: 13/462,911

(22) Filed: May 3, 2012

(65) Prior Publication Data

US 2012/0214274 A1    Aug. 23, 2012

Related U.S. Application Data

(62) Division of application No. 12/106,414, filed on Apr. 21, 2008, now Pat. No. 8,198,531.

(30) Foreign Application Priority Data

Aug. 10, 2007 (TW) .............................. 096129509 A

(51) Int. Cl.
*H01L 31/04* (2014.01)
*H01L 31/0224* (2006.01)
*H01L 31/18* (2006.01)
*H01L 51/42* (2006.01)
*H01G 9/20* (2006.01)
*H01L 51/00* (2006.01)

(52) U.S. Cl.
CPC ........ *H01L 31/022433* (2013.01); *H01L 31/18* (2013.01); *H01L 51/4226* (2013.01); *H01L 51/4233* (2013.01); *H01L 51/4266* (2013.01); *H01G 9/2036* (2013.01); *H01L 31/04* (2013.01); *H01L 51/0036* (2013.01); *Y02E 10/549* (2013.01)

(58) Field of Classification Search
CPC .................................................. H01L 21/02551
See application file for complete search history.

(56) References Cited

U.S. PATENT DOCUMENTS

| 28,961 A | 7/1860 | Boynton |
| 5,350,459 A * | 9/1994 | Suzuki et al. ................. 136/263 |
| 6,239,355 B1 | 5/2001 | Salafsky |
| 6,649,824 B1 | 11/2003 | Den et al. |
| 2006/0249201 A1 | 11/2006 | Lawandy |
| 2007/0190880 A1 * | 8/2007 | Dubrow et al. ............... 442/181 |

OTHER PUBLICATIONS

Lin et al., "Efficient photoinduced charge transfer in TiO2 nanorod/conjugated polymer hybrid materials," 2006, Nanotechnology, 17, pp. 5781-5785.*

* cited by examiner

*Primary Examiner* — Robert Vetere
(74) *Attorney, Agent, or Firm* — WPAT, PC; Justin King

(57) ABSTRACT

The present invention discloses a solar cell having a multi-layered structure that is used to generate, transport, and collect electric charges. The multi-layered nanostructure comprises a cathode, a conducting metal layer, a photo-active layer, a hole-transport layer, and an anode. The photo-active layer comprises a tree-like nanostructure array and a conjugate polymer filler. The tree-like nanostructure array is used as an electron acceptor while the conjugate polymer filler is as an electron donor. The tree-like nanostructure array comprises a trunk part and a branch part. The trunk part is formed in-situ on the surface of the conducting metal layer and is used to provide a long straight transport pathway to transport electrons. The large contact area between the branch part and the conjugate polymer filler provides electron-hole separation.

17 Claims, 7 Drawing Sheets

METHOD FOR FORMING A SOLAR CELL WITH TREE-LIKE NANOSTRUCTURE

CROSS REFERENCE TO RELATED APPLICATIONS

This is a divisional of U.S. Ser. No. 12/106,414, now U.S. Pat. No. 8,198,531, filed Apr. 21, 2008 by the same inventors, and claims priority there from. This divisional application contains rewritten claims to the restricted-out subject matter of original claims.

BACKGROUND OF THE INVENTION

1. Field of the Invention

The present invention is generally related to a solar cell and a method for preparing the same, and more particularly to a solar cell having a tree-like nanostructure and a method for preparing the same.

2. Description of the Prior Art

At present, polymer solar cells attract great research interests because the various advantages compared to the traditional silicon-based solar cells. For example, the fabrication cost is low and it is easy to fabricate a cell with large area, transparent cell, and flexible cell, etc. However, the cell efficiency of a polymer solar cell is still low. Thus, developing a polymer solar cell with high efficiency becomes an important research target.

The operating principle of polymer solar cells is as follows. When a polymer cell is irradiated by sun, the conjugate polymer in the polymer solar cell absorbs sunlight to have its electron in the highest occupied molecular orbital (HOMO) excited to the lowest unoccupied molecular orbital (LUMO) and then a hole is generated in HOMO to form an electron-hole pair, called exciton. This exciton can generate effective electron-hole separation at the interface between the electron acceptor and the electron donor and then the electron and the hole are transported to the external circuit to generate electric current, via electron transport substance and hole transport substance, respectively. Thus, solar energy is transformed into electric energy. In the process of this energy conversion, solar cell efficiency is highly related to the mechanism of separating the electron-hole pair, the life time of the exciton, and the pathway of electric current transport.

In order to increase solar cell efficiency, the current polymer solar cell uses the mixture of semiconductor nanoparticles and conjugate polymers by using solvent to blend semiconductor nanoparticles and conjugate polymers so as to thereby increase the area of the interface between the electron acceptor and the electron donor. Generally, it requires forming bi-continuous phase between nanoparticles and conjugate polymers to prevent from lowering the efficiency of charge transport. In such case, higher nanoparticle concentration is required. However, as the nanoparticle concentration is high, coagulation between nanoparticles occurs and the area of the interface between the electron acceptor and the electron donor is thereby decreased to further lower the efficiency of electron-hole separation and the quantum efficiency of energy transfer. On the other hand, as the properties of nanoparticles are significantly different from those of conjugate polymers, directly physically blending these two substances will result in serious phase separation so that the exciton generated by light excitation can not have good charge transfer to thereby lower the efficiency of energy conversion of the device. Even though the nanoparticles and the polymers are well blended, the charge transport speed is still limited due to the non-linear transport pathway.

To solve the above-mentioned problems associated with the current method, the invention discloses a novel solar cell having a tree-like nanostructure and a method for preparing the same.

SUMMARY OF THE INVENTION

One objective of the present invention is to use a tree-like nanostructure array and conjugate polymer fillers to form a photo-active layer. Since the in-situ synthesis trunk part provides a long straight transport pathway to transport electrons and the large contact area between the branch part and the conjugate polymer filler provides electron-hole separation, the energy conversion efficiency of a solar cell can be increased multiple times. Therefore, this present invention does have the economic advantages for industrial applications.

Accordingly, the present invention discloses a solar cell having a multi-layered structure that is used to generate, transport, and collect electric charges. The multi-layered nanostructure comprises a cathode, a conducting metal layer, a photo-active layer, a hole transport layer, and an anode. The photo-active layer comprises a tree-like nanostructure array and a conjugate polymer filler. The tree-like nanostructure array is used as an electron acceptor while the conjugate polymer filler is as an electron donor. The tree-like nanostructure array comprises a trunk part and a branch part. The trunk part is formed in-situ on the surface of the conducting metal layer and is used to provide a long straight transport pathway to transport electrons. The large contact area between the branch part and the conjugate polymer filler provides electron-hole separation.

DESCRIPTION OF THE PREFERRED EMBODIMENTS

What is probed into the invention is a solar cell having a tree-like nanostructure and a method for preparing the same. Detail descriptions of the structure and elements will be provided in the following in order to make the invention thoroughly understood. Obviously, the application of the invention is not confined to specific details familiar to those who are skilled in the art. On the other hand, the common structures and elements that are known to everyone are not described in details to avoid unnecessary limits of the invention.

Figure 1:
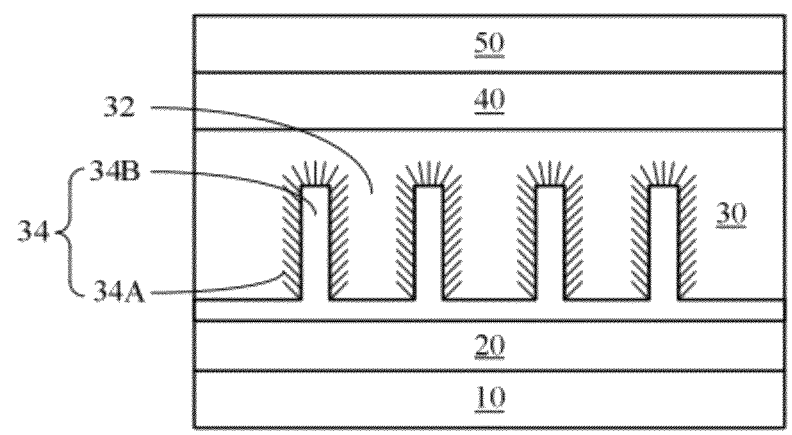
FIG. 1 shows a schematic diagram illustrating a solar cell having a multi-layered structure according to example 1 of the invention.

A first embodiment of the present invention discloses a solar cell having a multi-layered structure that is used to generate, transport, and collect electric charges. Referring to FIG. 1, the multi-layered structure comprises a cathode 10, a metal conducting layer 20, a photo-active layer 30, a hole-transport layer 40, and an anode 50. The photo-active layer 30 comprises a tree-like nanostructure array 34 and a conjugate polymer filler 32. The tree-like nanostructure array is used as an electron acceptor while the conjugate polymer filler is as an electron donor. The tree-like nanostructure array 34 comprises a trunk part 34B and a branch part 34A. The trunk part 34B is formed in-situ on the surface of the conducting metal layer and is used to provide a long straight transport pathway to transport electrons. The large contact area between the branch part 34A and the conjugate polymer filler 32 provides electron-hole separation.

The spacing between the trunk parts is less than or equal to 300 nm, preferably less than or equal to 150 nm. The diameter of the trunk part is more than or equal to 30 nm, preferably more than or equal to 50 nm. The length of the trunk part is more than or equal to 50 nm, preferably more than or equal to 100 nm. Relatively, the diameter of the branch part is less than or equal to 10 nm while the length of the branch part is less than or equal to 30 nm.

The material of the above-mentioned trunk part is selected from the group consisting of the following: inorganic material, metal material, or mixture of inorganic and metal materials; preferably comprising one material selected from the group consisting of the following or alloy thereof: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, InBi, GaBi, TlBi, Cu—In—Ga—Se, and Cu—In—Ga—S.

In this embodiment, the material of the branch part can be the same as or different from that of the trunk part. The material of the branch part is selected from the group consisting of the following: inorganic material, metal material, or mixture of inorganic and metal materials; preferably comprising one material selected from the group consisting of the following or alloy thereof: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, inBi, GaBi, TlBi, Cu—In—Ga—Se, and Cu—In—Ga—S. Besides, the preferred material for the cathode is ITO (indium tin oxide) or FTO (fluorine-doped tin oxide). The preferred material for the conducting metal layer is gold and the preferred anode is gold.

The conjugate polymer filler is a polymer, oligomer, macromolecule, or copolymer comprising a conjugated structure, preferably comprising the substance(s) selected from the group consisting of the following or any combination of the following: polyanilines and derivatives thereof; polypyrroles and derivatives thereof; polythiophenes and derivatives thereof; poly(p-phenylene vinylene) and derivatives thereof; and polymer, oligomer or copolymer containing the structure of aniline, pyrrole, thiophene, p-phenylene vinylene or derivatives thereof. More preferably, it comprises the substance(s) selected from the group consisting of the following or any combination of the following: poly[2-methoxy, 5-(2-ethylhexoxy)-1,4-phylene vinylene] (MEH-PPV), MDMO-PPV, polybithiophene, poly(3-akylthiophene), poly(3-hexylthiophene) (P3HT), and poly(3,4-ethylenedioxythiophene) (PEDOT).

A second embodiment of the present invention discloses a solar cell having a multi-layered structure. The multi-layered structure comprises a cathode, a photo-active layer, a hole-transport layer, and an anode. The photo-active layer comprises a tree-like nanostructure array and a conjugate polymer filler. The tree-like nanostructure array is used as an electron acceptor while the conjugate polymer filler is as an electron donor. The tree-like nanostructure array comprises a trunk part and a branch part. The trunk part is formed in-situ on the surface of the cathode and is used to provide a long straight transport pathway to transport electrons. The large contact area between the branch part and the conjugate polymer filler provides electron-hole separation. In addition, the reaction for in-situ forming the trunk part comprises the method selected from the group consisting of the following: evaporation method, mold template method, and chemical vapor deposition.

The spacing between the trunk parts is less than or equal to 300 nm, preferably less than or equal to 150 nm. The diameter of the trunk part is more than or equal to 30 nm, preferably more than or equal to 50 nm. The length of the trunk part is more than or equal to 50 nm, preferably more than or equal to 100 nm. Relatively, the diameter of the branch part is less than or equal to 10 nm while the length of the branch part is less than or equal to 30 nm. In addition, in this embodiment, the selection of the materials for the trunk part, the branch part, the cathode, the anode, the conjugate polymer filler is in the same manner as that in the first embodiment.

A third embodiment of the invention discloses a method for preparing a solar cell. At first, a cathode layer is provided by evaporating, sputtering, or coating. A conducting metal layer is then formed on the cathode. Next, a plurality of trunk parts are in-situ formed on the conducting metal layer. Then, a solution comprising a conjugate polymer filler and a plurality of branch parts is provided. The branch parts are synthesized by the sol-gel method. Following that, the solution is infiltrated into spaces between trunk parts to have the branch parts deposited on the trunk parts (the force between them generally is Van der Waal force) so as to form a tree-like nanostructure array and to have the conjugate polymer filler cover and fill in the tree-like nanostructure array at the same time. The tree-like nanostructure array is used as an electron acceptor while the conjugate polymer filler is as an electron donor. The trunk part is used to provide a long straight transport pathway to transport electrons and the large contact area between the branch part and the conjugate polymer filler provides electron-hole separation. The tree-like nanostructure array and the conjugate polymer filler function together as a photo-active layer in the solar cell. A hole-transport layer is formed on the photo-active layer for assisting in transporting holes as well as filling up cavities to have the surface be smooth. Finally, an anode is formed on the hole-transport layer.

The reaction for in-situ forming the trunk parts is carried out by pulsed current electrolysis under the existence of the conducting metal layer. The energy gaps between the trunk part and the branch part have to associate to each other in order to transport electrons quickly. In this embodiment, the preferred material for the trunk part is zinc oxide because of its broad direct energy gap (3.37 eV). Therefore, it is easy to associate with the branch part made of other materials.

The zinc oxide is taken as an example. The common synthetic methods of zinc oxide nanocolumn will be introduced in the following.

1. Evaporation:

The evaporation method is the simplest method to synthesize one-dimensional nano-material. By this method, various structures of zinc oxide can be synthesized, such as nanocolumn, nanowire, nanobelt, nanorod. The above synthesis usually occurs in a quartz furnace tube and the mixture of zinc oxide (usually powders) to be synthesized is placed in the center of the alumina or quartz furnace tube where the quartz furnace tube is in a horizontal heating furnace and the temperature, pressure, and evaporating time can be controlled. Before evaporation, the tube is vacuumed to have a pressure of $10^{-3}$ torr by a vacuum pump. As the reaction temperature is reached, zinc oxide is evaporated and carried by the inactive gas (Ar) to the substrate for growing nanowires or deposited on the wall of the tube. By this evaporation method, the high temperature (>1000° C.) is required for synthesis because of the high melting point and low vapor pressure of zinc oxide.

2. Mold Templating:

The mold template method is one of the methods for synthesizing one-dimensional nano-material. Traditionally, AAO (anodic aluminum oxide) is commonly used as the template since AAO can be dissolved in basic solution easily. Using AAO as the template, let nanocolumn or nanowire or nanorod material be filled into the holes. Then, the nanocolumn material can be obtained after having AAO be dissolved. The mold template method for synthesizing zinc oxide comprises two steps: (1) electroplating pure zinc metal in the pores of AAO to form the zinc metal with nano-column structure; and (2) heating the AAO in air at 700~800° C. to have zinc metal oxidize to form zinc oxide with nano-column structure.

3. Chemical Vapor Deposition (CVD)

Chemical vapor deposition, which is mainly a kind of pyrolysis reaction, has many advantages in synthesizing zinc oxide nano-column, such as having lower growth temperature, controllable number of atoms, wide deposition area, and high growth rate. By the CVD method, zinc oxide nanocolumn or nanorods can be synthesized on a variety of substrates and the temperature of synthesis is relatively low (about 500° C.). The source for zinc can be zinc acetylacetonate hydrate, whose evaporating temperature is about 130~140° C. $N_2/O_2$ gas mixture can be used as carrier gas. As zinc gas is carried to the substrate area, it will deposit on the substrate due to the lowered temperature and the interaction between oxygen and zinc to form zinc oxide nano-column. Generally, the diameter is about 60~80 nm.

The spacing between the trunk parts is less than or equal to 300 nm, preferably less than or equal to 150 nm. The diameter of the trunk part is more than or equal to 30 nm, preferably more than or equal to 50 nm. The length of the trunk part is more than or equal to 50 nm, preferably more than or equal to 100 nm. Relatively, the diameter of the branch part is less than or equal to 10 nm while the length of the branch part is less than or equal to 40 nm.

In this embodiment, the selection for the materials of the trunk part, branch part, cathode, anode, conjugate polymer filler is the same as that in the first embodiment.

A fourth embodiment of the invention discloses a method for preparing a solar cell. At first, a cathode layer is provided by evaporating, sputtering, or coating. A conducting metal layer is then formed on the cathode. Next, a plurality of trunk parts are in-situ formed on the conducting metal layer. A deposition process is carried out to deposit a plurality of first branch parts on the surface of the trunk parts. Then, a solution comprising a conjugate polymer filler and a plurality of second branch parts is provided. The first and second branch parts are synthesized by the sol-gel method. Following that, the solution is infiltrated into spaces between trunk parts to have the second branch parts deposited on the first branch parts (the force between them generally is Van der Waal force), which are on the surface of the trunk parts, so as to form a tree-like nanostructure array and to have the conjugate polymer filler cover and fill in the tree-like nanostructure array at the same time. The tree-like nanostructure array is used as an electron acceptor while the conjugate polymer filler is as an electron donor. The trunk part is used to provide a long straight transport pathway for transporting electrons and the large contact area between the branch part and the conjugate polymer filler provides electron-hole separation. The tree-like nanostructure array and the conjugate polymer filler function together as a photo-active layer in the solar cell. Then, a hole-transport layer is formed on the photo-active layer for assisting in transporting holes as well as filling up cavities to have smooth surface. Finally, an anode is formed on the hole-transport layer.

The reaction for in-situ forming the trunk parts is carried out by pulsed current electrolysis under the existence of the conducting metal layer. In addition, the spacing between the trunk parts is less than or equal to 300 nm, preferably less than or equal to 150 nm. The diameter of the trunk part is more than or equal to 30 nm, preferably more than or equal to 50 nm. The length of the trunk part is more than or equal to 50 nm, preferably more than or equal to 100 nm. Relatively, the diameter of the first and second branch parts is less than or equal to 10 nm while the length of the first and second branch parts is less than or equal to 40 nm.

The material of the above-mentioned first and second branch parts are inorganic semiconducting materials, metal oxide materials, or mixtures of inorganic and metal oxide materials. Preferably, the first and second branch parts independently comprise one or more material(s) selected from the group consisting of the following: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, InBi, GaBi, TlBi, Cu—In—Ga—Se, and Cu—In—Ga—S.

In this embodiment, the selection of the materials for the trunk part, branch part, cathode, anode, conjugate polymer filler is the same as that in the first embodiment.

EXAMPLE 1

Forming Zinc Oxide Trunk Part Array

Figure 2:
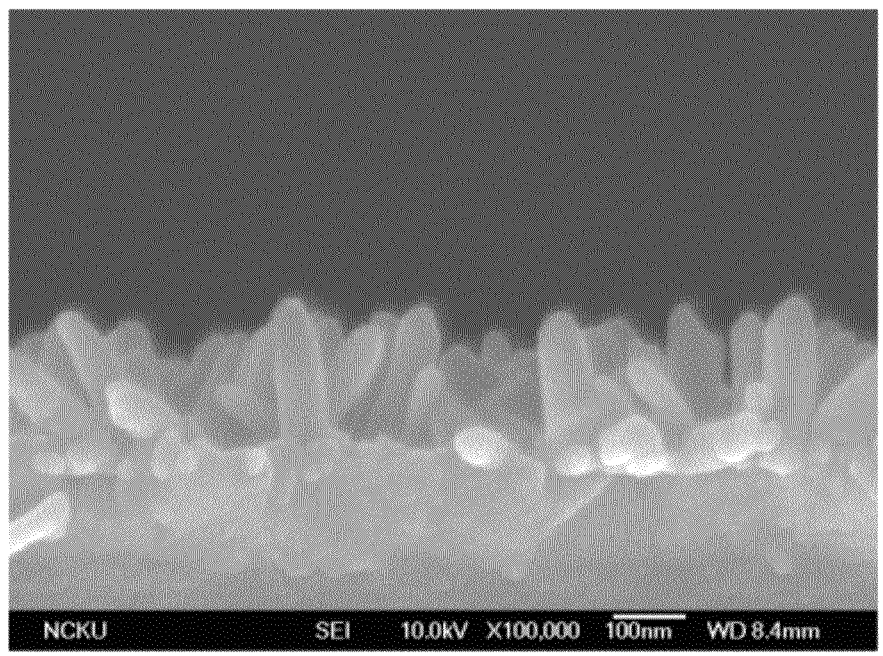
FIG. 2 shows a scanning electron microscope (SEM) image of the array of ZnO nanorods according to example 1 of the present invention.

A conducting Au metal layer with a thickness of about 10 nm is formed on an ITO glass substrate by DC sputtering. Then, ZnO trunk part arrays are grown on the Au-coated ITO substrate by pulsed current electrolysis method at 80° C. If the ITO cathode is used as the working electrode in the current electrolysis method to in-situ form the trunk parts from ITO cathode, the trunk parts can not be uniformly formed. Thus, a conducting metal layer is coated as the working electrode in order to have the distribution of charges uniform so as to in-situ form the trunk parts regularly. The substrate, a platinum wire and an Ag/AgCl electrode are utilized as the working, the counter and the reference electrodes, respectively, in the electrochemical system. A 0.0025M aqueous solution of $Zn(NO_3)_2$ is employed to be the electrolyte. A pulsed wave with a pulse length and a pulse period of 0.01 and 0.1 s, respectively, are used for the growth of ZnO trunk part arrays. The pulsed current density is −2 mA/cm². FIG. 2 shows the typical scanning electron micrograph (SEM) of the ZnO trunk part arrays formed by pulsed current electrolysis method at 80° C. The diameter and the length of the ZnO trunk part are about 50 nm and 150 nm, respectively. The average spacing between trunk parts is of the order of ~120 nm.

EXAMPLE 2

Forming Titanium Oxide Branch Part

Figure 3:
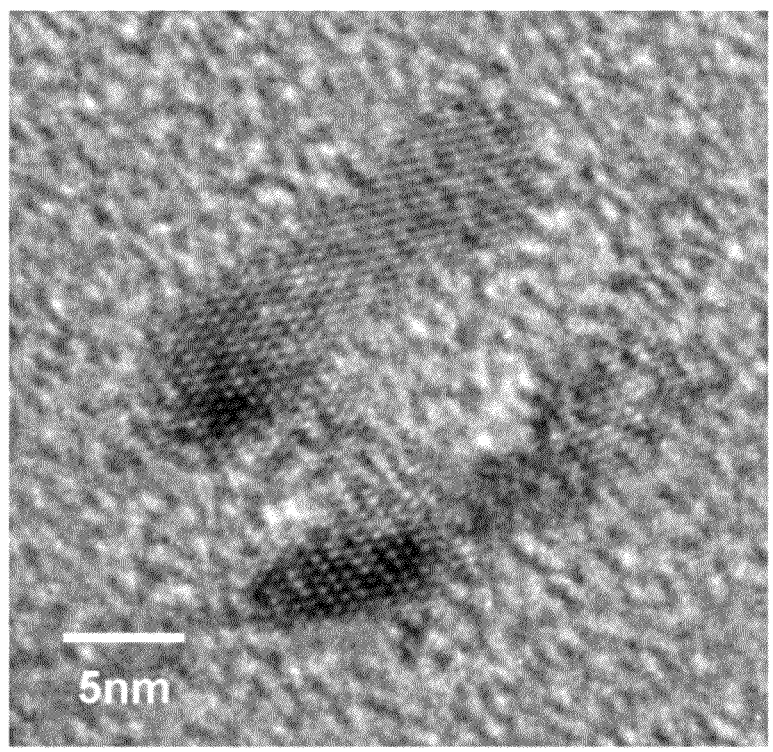
FIG. 3 shows a high-resolution transmission electron microscope (HRTEM) image of the titanium oxide branch part according to example 2 of the present invention.

High aspect ratio anatase $TiO_2$ branch parts are synthesized by the sol-gel method with hydrolysis of titanium tetraisopropoxide as described in Nanotechnology, 17, 5781, (2006) by Y. T. Lin, T. W. Zeng, W. Z. Lai, C. W. Chen, Y. Y. Lin, Y. S. Chang, W. F. Su. FIG. 3 shows the high-resolution transmission electron microscopy (HRTEM) image of $TiO_2$ branch parts where the dimension of $TiO_2$ branch parts is about 5 nm in diameter and 20 nm in length. The P3HT solution is prepared by dissolving conjugate polymer P3HT (Aldrich, USA) in chloroform. The mixture solution with 50 wt % $TiO_2$ branch parts is obtained by mixing the required amount of $TiO_2$ branch parts with the P3HT solution. By spin coating, the mixture solution is infiltrated in the cavities between ZnO trunk part arrays for $TiO_2$ branch parts to deposit on the ZnO trunk parts. The conjugate polymer P3HT has hole transport and light absorbing functions.

EXAMPLE 3

Preparing a Solar Cell Having a Tree-Like Nanostructure

In air, a PEDOT:PSS layer with a thickness of 50 nm is coated on the device formed in example 2 by spin coating. PEDOT:PSS material has high conductivity and thus can reduce interface resistance. In addition, it can fill up gaps to have smooth surface. After the PEDOT:PSS coating process is finished, it is baked at 120° C. under vacuum for 6 hours. Finally, at a pressure of $2\times10^{-6}$ torr, gold (Au) is evaporated to form a gold layer as the anode.

Result 1

The time-resolved photoluminescence spectra are obtained by a time-correlated single photon counting (TCSPC) spectrometer (Picoquant, Inc.). A pulse laser (375 nm) with an average power of 1 mW operating at 40 MHz with duration of 70 ps is used for excitation. The current-voltage measurement for the device prepared in example 3 is obtained by using a solar simulator (Oriel Inc.) with the A.M. 1.5 filter. Transient photocurrent measurements are performed by a frequency-tripled Nd:YAG pulsed laser ($\lambda$=355 nm and pulse width ~5 ns) and the signals are recorded by a digital oscilloscope (Tetronix TDS5052B). The film thickness is measured by means of the Veeco M6 surface profiler.

Figure 4:
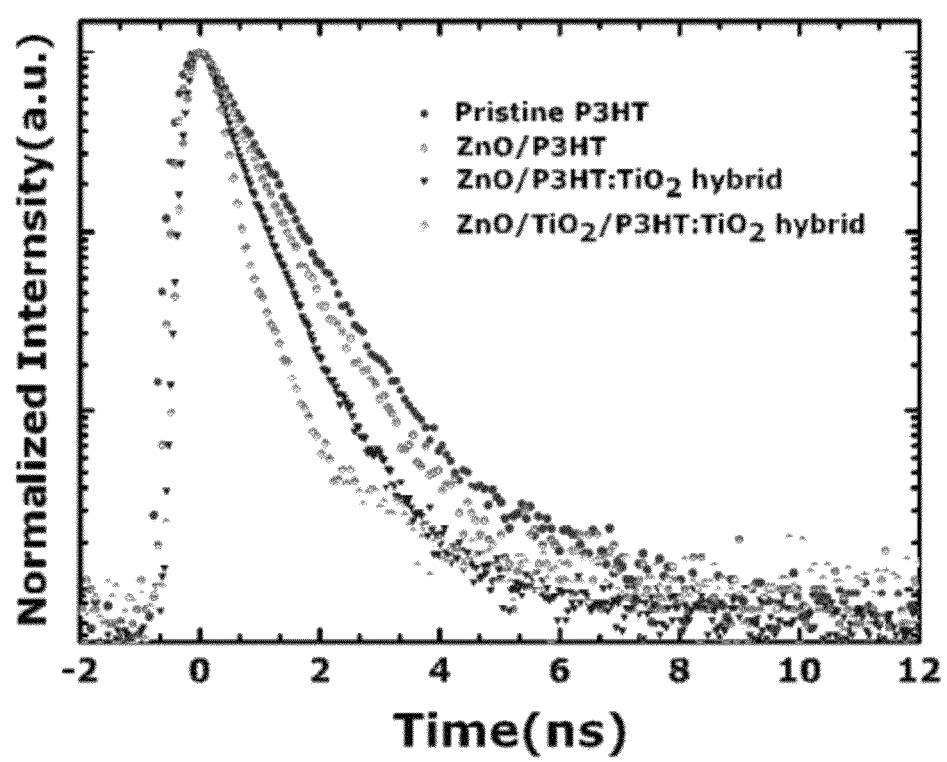
FIG. 4 shows time-resolved photoluminescence spectra of the four samples according to example 1 of the present invention, where Sample A (P3HT) represents neat pristine P3HT deposited on the silicon substrate, Sample B (ZnO/P3HT) and Sample C (ZnO/P3HT:$TiO_2$) represent the composites by spin coating neat P3HT and P3HT:$TiO_2$ mixture onto the array of ZnO nanorods, respectively, and Sample D (ZnO/$TiO_2$/P3HT:$TiO_2$) has a similar configuration to the Sample C but is precoated with a very thin $TiO_2$ nanorod layer onto ZnO nanorods before the P3HT:$TiO_2$ nanorod hybrid layer is deposited.

Charge separation efficiency at polymer/inorganic nanocrystal interfaces can be usually revealed through quenching of the photoluminescence (PL) efficiency and shortening of measured PL lifetime in polymer. Four samples consisting of different configurations are taken for investigation. The sample A (P3HT) represents the pristine P3HT thin film deposited on the silicon substrate. The sample B (ZnO/P3HT) and the sample C (ZnO/P3HT:$TiO_2$) represent the composites by spin coating neat P3HT and P3HT:$TiO_2$ nanorods hybrid thin active layers onto the array of ZnO trunk parts, respectively. The sample D (ZnO/$TiO_2$/P3HT:$TiO_2$) has a similar configuration to the sample C but is precoated with a very thin $TiO_2$ nanorod layer onto ZnO trunk part arrays before the P3HT:$TiO_2$ hybrid is deposited. All these samples have a similar thickness about 200 nm. FIG. 4 shows the PL decay spectra for these different samples. It is found that the PL lifetime $\tau_B$ (643 ps) for the sample B is shorter than the lifetime $\tau_A$ (735 ps) of the pristine P3HT thin film for sample A, indicating that charge separation occurs at the interfaces between P3HT and ZnO by providing a new non-radiative process for photogenerated excitons. The shorter PL lifetime $\tau_C$ (509 ps) for the Sample C than that of the sample B indicates that a large number interfaces between polymer and $TiO_2$ nanorods are generated, after $TiO_2$ nanorods are blended with P3HT, to have more efficient charge separation and thus to result in the shorter PL lifetime. For the sample D, the PL decay lifetime $\tau_D$ (361 ps) is even shorter than $\tau_C$ due to the increasing number of interfaces on the surface of ZnO trunk part arrays by coating a thin $TiO_2$ nanorod layer before infiltrating the P3HT:$TiO_2$ active layer. As a result, more efficient exciton dissociation occurs.

The role of the thin $TiO_2$ nanorod layer can be as follow. Firstly, inserting this layer can create a second interfacial area for exciton dissociation that might increase the charge transfer rate. Secondly, the thin $TiO_2$ nanorods are able to be connected to the $TiO_2$ nanorods in the active P3HT:$TiO_2$ hybrid to form a continuous pathway for electron transport after charge separation.

Figure 5:
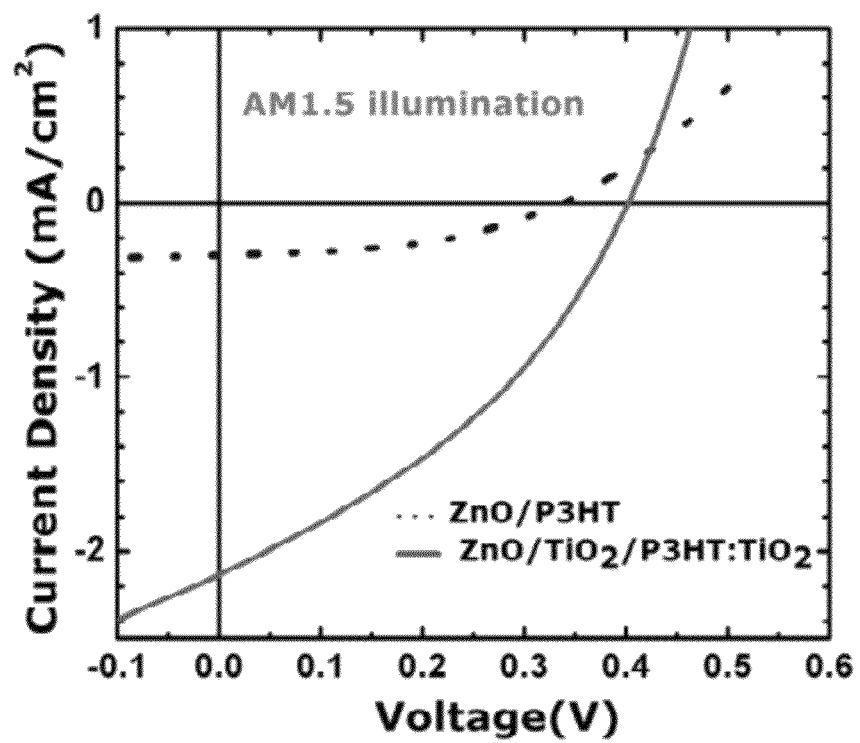
FIG. 5 shows the I-V characteristic curves of the device B and device D by irradiated with a sun simulator having AM 1.5 light filter to simulate the sunlight radiation according to example 2 of the present invention.

The solar cell having tree-like nanostructure provided by example 3 [photoactive layer is sample D (ZnO/$TiO_2$/P3HT:$TiO_2$), hereinafter abbreviated as device D] is irradiated by a solar simulator with the A.M. 1.5 filter and the current-voltage characteristic curve of the device is measured, as shown in FIG. 5. For comparison, the current-voltage characteristic curve of the device with a photoactive layer of sample B (ZnO/P3HT)(hereinafter abbreviated as device B) is also shown. The device B has a short circuit current density ($J_{sc}$) of 0.3 mA/cm$^2$, an open circuit voltage ($V_{oc}$) of 335 mV, a fill factor (FF) of 0.40, and a power conversion efficiency ($\eta$) of 0.04%. On the contrary, the short circuit current density ($J_{sc}$), open circuit voltage ($V_{oc}$), fill factor (FF), and power conversion efficiency ($\eta$) of the device D are 2.2 mA/cm$^2$, 400 mV, 0.35, and 0.31%, respectively. The short circuit current density ($J_{sc}$) of the device D is over seven times $J_{sc}$ of the device B.

Figure 6:
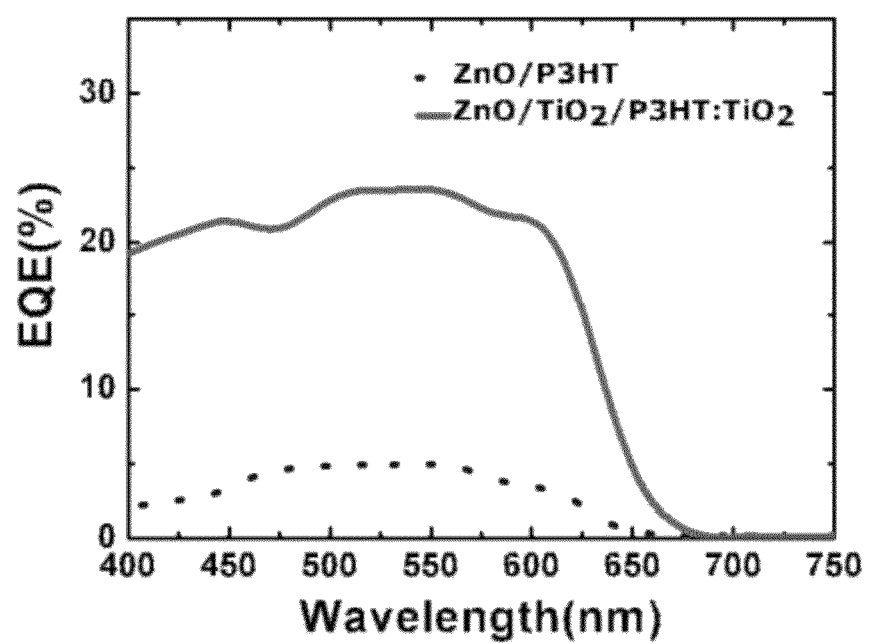
FIG. 6 shows the external quantum efficiency (EQE) vs. wavelength relationship diagrams of the device B and the device D according to example 2 of the present invention.

FIG. 6 shows the external quantum efficiency (EQE) vs. wavelength relationship diagrams of the device B and the device D. The maximum EQE of device D is about 23% at 510 nm. Enhancement in the device performance based on the tree-like structure is mainly attributed to efficient charge separation from the increased interfacial area and to effective carrier transport from the formation of continuous pathways by incorporating $TiO_2$ nanorods.

Figure 7:
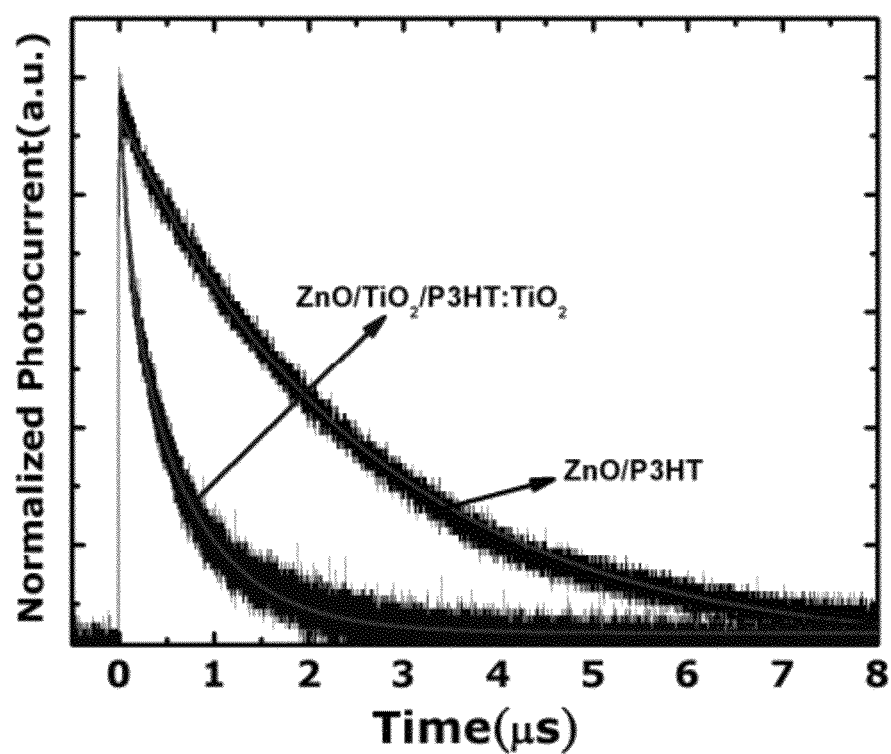
FIG. 7 shows the photocurrent decay curves of the device B and the device D according to example 2 of the present invention.

FIG. 7 shows the photocurrent decay curves of the above devices. It is found that the tree-like nanostructured device (device D) has a faster responding time (~0.5 μs) with respect to the responding time (~2.4 μs) of the device B, indicating that effective carrier transport can also be achieved through this design of the tree-like device architecture.

Obviously many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. A method for forming a photo-active layer of a solar cell, the method comprising:
   in-situ forming a plurality of trunk parts on a conducting metal layer;
   performing a deposition process to deposit a plurality of first branch parts on said trunk parts;
   providing a solution comprising a conjugate polymer filler and a plurality of second branch parts; and
   infiltrating said solution into spaces between trunk parts to have said second branch parts deposited on said first branch parts of the surfaces of said trunk parts so as to form a tree-like nanostructure array which of the spaces between said trunk parts in the array is less than or equal to 300 nm, the diameter of each said trunk part is more than or equal to 30 nm, the length of each said trunk part is more than or equal to 50 nm, the diameter of each said branch part is less than or equal to 10 nm, the length of each said branch part is less than or equal to 30 nm and to have said conjugate polymer filler cover and fill in said tree-like nanostructure array at the same time wherein said tree-like nanostructure array is used as an electron acceptor, said conjugate polymer filler is as an electron donor, said trunk part is used to provide a long straight transport pathway to transport electrons, the large contact area between said branch part and said conjugate polymer filler provides electron-hole separation, and said tree-like nanostructure array and said conjugate polymer filler function together as said photo-active layer of the solar cell.

2. The method according to claim 1, wherein the reaction for in-situ forming said trunk part is to carry out pulsed current electrolysis in the existence of said conducting metal layer.

3. The method according to claim 1, wherein said first branch part and said second branch part are synthesized by sol-gel method.

4. The method according to claim 1, wherein the material of said trunk part is an inorganic semiconductor, metal oxide, or mixture of inorganic and metal oxide materials.

5. The method according to claim 1, wherein the material of said trunk part is the material(s) selected from the group consisting of the following or any combination of the following: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, InBi, GaBi, TlBi, Cu—In—Ga—Se, and Cu—In—Ga—S.

6. The method according to claim 1, wherein the materials of said first branch and said second branch part each are inorganic semiconductors, metal oxides, or mixtures of inorganic and metal oxide materials.

7. The method according to claim 1, wherein the materials of said first branch and said second branch part are independently the material(s) selected from the group consisting of the following or any combination of the following: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, InBi, GaBi, TlBi, Cu—In—Ga—Se, and Cu—In—Ga—S.

8. The method according to claim 1, wherein said conducting metal layer is formed on a cathode of the solar cell.

9. The method according to claim 1, wherein said photo-active layer is used to form the solar cell, and the method for forming the solar cell comprises forming a hole transport layer on said photo-active layer.

10. The method according to claim 9, wherein the method for forming the solar cell further comprises forming an anode on said hole transport layer.

11. A method for forming a solar cell with a tree-like structure, the method comprising:
   in-situ forming a plurality of trunk parts on a conducting metal layer of a cathode;
   performing a deposition process to deposit a plurality of first branch parts on said trunk parts;
   providing a solution comprising a conjugate polymer filler and a plurality of second branch parts;
   infiltrating said solution into spaces between trunk parts to have said second branch parts deposited on said first branch parts of the surfaces of said trunk parts so as to form a tree-like nanostructure array which of the spaces between said trunk parts in the array is less than or equal to 300 nm, the diameter of each said trunk part is more than or equal to 30 nm, the length of each said trunk part is more than or equal to 50 nm, the diameter of each said branch part is less than or equal to 10 nm, the length of each said branch part is less than or equal to 30 nm and to have said conjugate polymer filler cover and fill in said tree-like nanostructure array at the same time wherein said tree-like nanostructure array is used as an electron acceptor, said conjugate polymer filler is as an electron donor, said trunk part is used to provide a long straight transport pathway to transport electrons, the large contact area between said branch part and said conjugate polymer filler provides electron-hole separation, and said tree-like nanostructure array and said conjugate polymer filler function together as a photo-active layer in said solar cell;
   forming a hole transport layer on said photo-active layer; and
   forming an anode on said hole transport layer.

12. The method according to claim 11, wherein the reaction for in-situ forming said trunk part is to carry out pulsed current electrolysis in the existence of said conducting metal layer.

13. The method according to claim 11, wherein said first branch part and said second branch part are synthesized by sol-gel method.

14. The method according to claim 11, wherein the material of said trunk part is an inorganic semiconductor, metal oxide, or mixture of inorganic and metal oxide materials.

15. The method according to claim 11, wherein the material of said trunk part is the material(s) selected from the group consisting of the following or any combination of the following: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, InBi, GaBi, TlBi, Cu—In—Ga—Se, and Cu—In—Ga—S.

16. The method according to claim 11, wherein the materials of said first branch and said second branch part each are inorganic semiconductors, metal oxides, or mixtures of inorganic and metal oxide materials.

17. The method according to claim 11, wherein the materials of said first branch and said second branch part are independently the material(s) selected from the group consisting of the following or any combination of the following: $TiO_2$, CdS, FeS, CdSe, GaAs, GaP, ZnO, $Fe_2O_3$, $SnO_2$, SiC, InN, InGaN, GaN, PbS, PbTe, PbSe, $Bi_2S_3$, InBi, GaBi, TlBi, Cu—In—Ga—Se, and Cu—In—Ga—S.

* * * * *